United States Patent
Liu et al.

(10) Patent No.: US 10,770,464 B2
(45) Date of Patent: Sep. 8, 2020

(54) SEMICONDUCTOR DEVICE INCLUDING BIT LINE STRUCTURE OF DYNAMIC RANDOM ACCESS MEMORY (DRAM) AND METHOD FOR FABRICATING THE SAME

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Chih-Chien Liu, Taipei (TW); Chia-Lung Chang, Tainan (TW); Tzu-Chin Wu, Chiayi County (TW); Wei-Lun Hsu, Taichung (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 15/896,091

(22) Filed: Feb. 14, 2018

(65) Prior Publication Data
US 2019/0221570 A1    Jul. 18, 2019

(30) Foreign Application Priority Data
Jan. 18, 2018   (CN) .......................... 2018 1 0048649

(51) Int. Cl.
*H01L 23/532* (2006.01)
*H01L 27/108* (2006.01)

(52) U.S. Cl.
CPC .. *H01L 27/10885* (2013.01); *H01L 23/53295* (2013.01); *H01L 27/10805* (2013.01); *H01L 27/10888* (2013.01)

(58) Field of Classification Search
CPC ......... H01L 27/10885; H01L 23/53295; H01L 27/10805
USPC ................................... 257/773; 438/618, 666
See application file for complete search history.

(56) References Cited

U.S. PATENT DOCUMENTS

| | | | |
|---|---|---|---|
| 8,309,449 B2 | 11/2012 | Jeong et al. | |
| 9,373,625 B2 | 6/2016 | Kim et al. | |
| 2003/0178688 A1 | 9/2003 | Yang | |
| 2013/0292847 A1* | 11/2013 | Choi | H01L 23/498 257/774 |
| 2013/0320550 A1* | 12/2013 | Kim | H01L 21/76897 257/773 |
| 2016/0118247 A1* | 4/2016 | Park | H01L 21/02247 438/703 |

FOREIGN PATENT DOCUMENTS

| | | | |
|---|---|---|---|
| CN | 105719998 A | 6/2016 | |
| CN | 201710130990.4 | * 3/2017 | ........ H01L 27/11521 |

* cited by examiner

*Primary Examiner* — Didarul A Mazumder
(74) *Attorney, Agent, or Firm* — Winston Hsu

(57) ABSTRACT

A method for fabricating semiconductor device includes the steps of: forming a bit line structure on a substrate; forming a first spacer, a second spacer, and a third spacer around the bit line structure; forming an interlayer dielectric (ILD) layer on the bit line structure; planarizing part of the ILD layer; removing the ILD layer and the second spacer to form a recess between the first spacer and the third spacer; and forming a liner in the recess.

6 Claims, 6 Drawing Sheets

US 10,770,464 B2

SEMICONDUCTOR DEVICE INCLUDING BIT LINE STRUCTURE OF DYNAMIC RANDOM ACCESS MEMORY (DRAM) AND METHOD FOR FABRICATING THE SAME

BACKGROUND OF THE INVENTION

1. Field of the Invention

The invention relates to a method for fabricating semiconductor device, and more particularly to a method for fabricating bit line structure of a dynamic random access memory (DRAM) device.

2. Description of the Prior Art

As electronic products develop toward the direction of miniaturization, the design of dynamic random access memory (DRAM) units also moves toward the direction of higher integration and higher density. Since the nature of a DRAM unit with buried gate structures has the advantage of possessing longer carrier channel length within a semiconductor substrate thereby reducing capacitor leakage, it has been gradually used to replace conventional DRAM unit with planar gate structures.

Typically, a DRAM unit with buried gate structure includes a transistor device and a charge storage element to receive electrical signals from bit lines and word lines. Nevertheless, current DRAM units with buried gate structures still pose numerous problems due to limited fabrication capability. Hence, how to effectively improve the performance and reliability of current DRAM device has become an important task in this field.

SUMMARY OF THE INVENTION

According to an embodiment of the present invention, a method for fabricating semiconductor device includes the steps of: forming a bit line structure on a substrate; forming a first spacer, a second spacer, and a third spacer around the bit line structure; forming an interlayer dielectric (ILD) layer on the bit line structure; planarizing part of the ILD layer; removing the ILD layer and the second spacer to form a recess between the first spacer and the third spacer; and forming a liner in the recess.

According to another aspect of the present invention, a semiconductor device includes: a bit line structure on a substrate; a first spacer around the bit line structure; a second spacer on a sidewall of the first spacer, and a third spacer on a sidewall of the second spacer. Preferably, the second spacer includes a bottom portion and a top portion, in which the bottom portion and the top portion comprise different material.

According to yet another aspect of the present invention, a semiconductor device includes: a bit line structure on a substrate; a first spacer around the bit line structure; a second spacer on a sidewall of the first spacer; a third spacer on a sidewall of the second spacer; and an air gap directly under the second spacer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
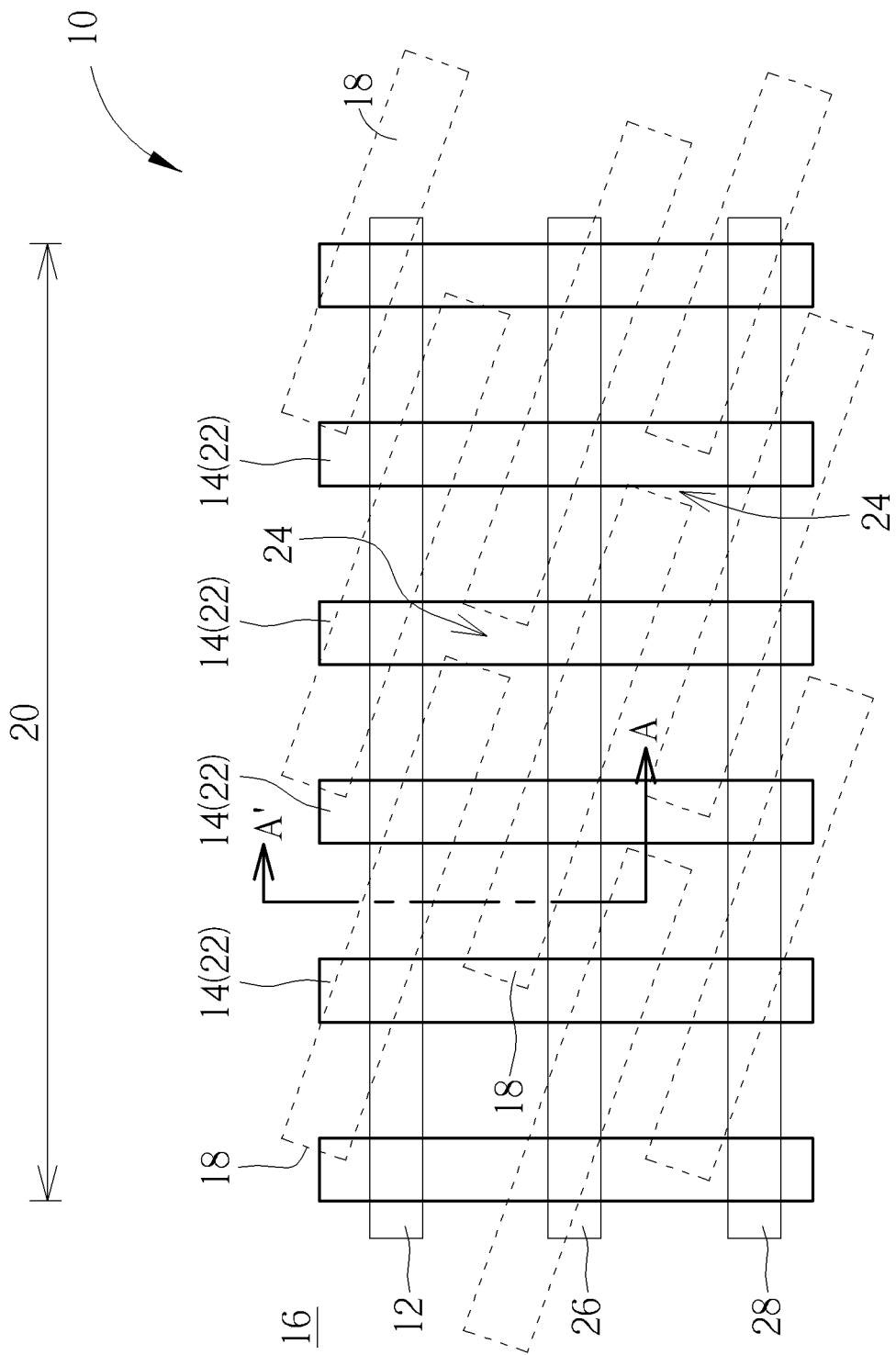
FIG. 1 illustrates a top-view diagram of a DRAM device according to an embodiment of the present invention.

Referring to FIGS. 1-10, FIGS. 1-10 illustrate a method for fabricating a DRAM device according to an embodiment of the present invention, in which FIG. 1 illustrates a top-view diagram of a DRAM device and FIGS. 2-10 illustrate cross-sectional views of a method for fabricating a bit line structure of the DRAM device along the sectional line AA' of FIG. 1. Preferably, the present embodiment pertains to fabricate a memory device, and more particularly a DRAM device 10, in which the DRAM device 10 includes at least a transistor device (not shown) and at least a capacitor structure (not shown) that will be serving as a smallest constituent unit within the DRAM array and also used to receive electrical signals from bit lines 12, 26, 28 and word lines 14.

As shown in FIG. 1, the DRAM device 10 includes a substrate 16 such as a semiconductor substrate or wafer made of silicon, a shallow trench isolation (STI) 24 formed in the substrate 16, and a plurality of active areas (AA) 18 defined on the substrate 16. A memory region 20 and a periphery region (not shown) are also defined on the substrate 16, in which multiple word lines 14 and multiple bit lines 12, 26, 28 are preferably formed on the memory region 20 while other active devices (not shown) could be formed on the periphery region. For simplicity purpose, only devices or elements on the memory region 20 are shown in FIG. 1 while elements on the periphery region are omitted.

In this embodiment, the active regions 18 are disposed parallel to each other and extending along a first direction, the word lines 14 or multiple gates 22 are disposed within the substrate 16 and passing through the active regions 18 and STI 24. Preferably, the gates 22 are disposed extending along a second direction, in which the second direction crosses the first direction at an angle less than 90 degrees.

The bit lines 12, 26, 28 on the other hand are disposed on the substrate 16 parallel to each other and extending along a third direction while crossing the active regions 18 and STI 24, in which the third direction is different from the first direction and orthogonal to the second direction. In other words, the first direction, second direction, and third direction are all different from each other while the first direction is not orthogonal to both the second direction and the third direction. Preferably, contact plugs such as bit line contacts (BLC) (not shown) are formed in the active regions 18 adjacent to two sides of the word lines 14 to electrically connect to source/drain region (not shown) of each transistor element and storage node contacts (not shown) are formed to electrically connect to a capacitor.

Figure 2:
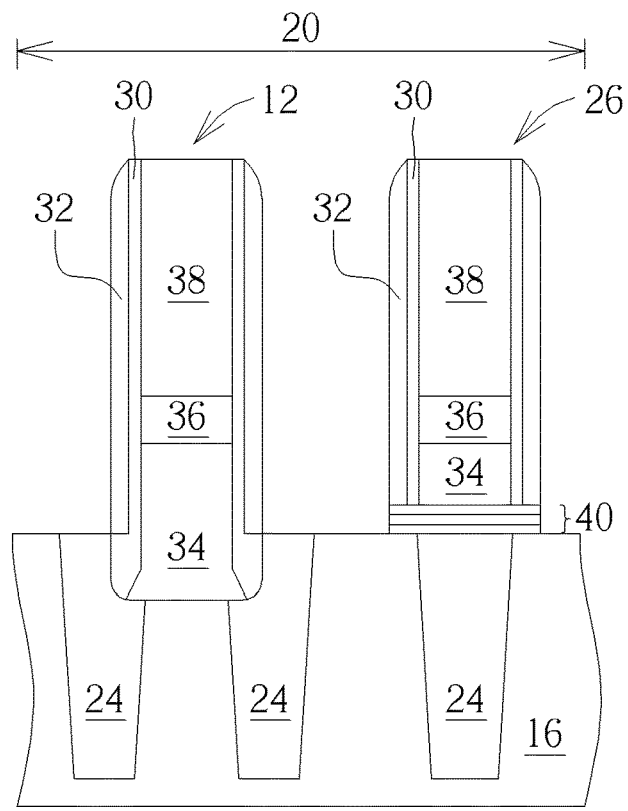
FIGS. 2-10 illustrate cross-sectional views of a method for fabricating a bit line structure of the DRAM device along the sectional line AA' of FIG. 1.

The fabrication process conducted after the formation of word lines 14 (or also referred to as buried word lines) is explained below. First as shown in FIG. 2, the aforementioned bit lines or bit line structures 12, 26, 28 are formed on the memory region 20 and gate structures (not shown) are formed on the periphery region. In this embodiment, elements including word lines (not shown), STI 24, and active region 18 could be formed in the substrate 16 under the bit line structures 12, 26 and a first spacer 30 and a second spacer 32 could be formed adjacent to two sides of each of the bit line structures 12, 26. Preferably, the bit line structure 12 could include a non-metal conductive layer 34, a selective barrier layer (not shown), a metal layer 36, and a mask layer 38 and the bit line structure 26 could include a stacked layer 40 made of oxide-nitride-oxide (ONO), a non-metal conductive layer 34, a selective barrier layer (not shown), a metal layer 36, and a mask layer 38. Preferably, the non-metal conductive layer 34 could include polysilicon, amorphous silicon, other silicon-containing or non-silicon containing non-metal conductive material, the barrier layer could include Ti, WSi, WN, or other suitable barrier material, the metal layer 36 could include Al, W, Cu, TiAl alloy, or other low resistance metal conductive material, and the mask layer 38 could include SiN, SiON, SiCN, or other insulating material.

Figure 3:
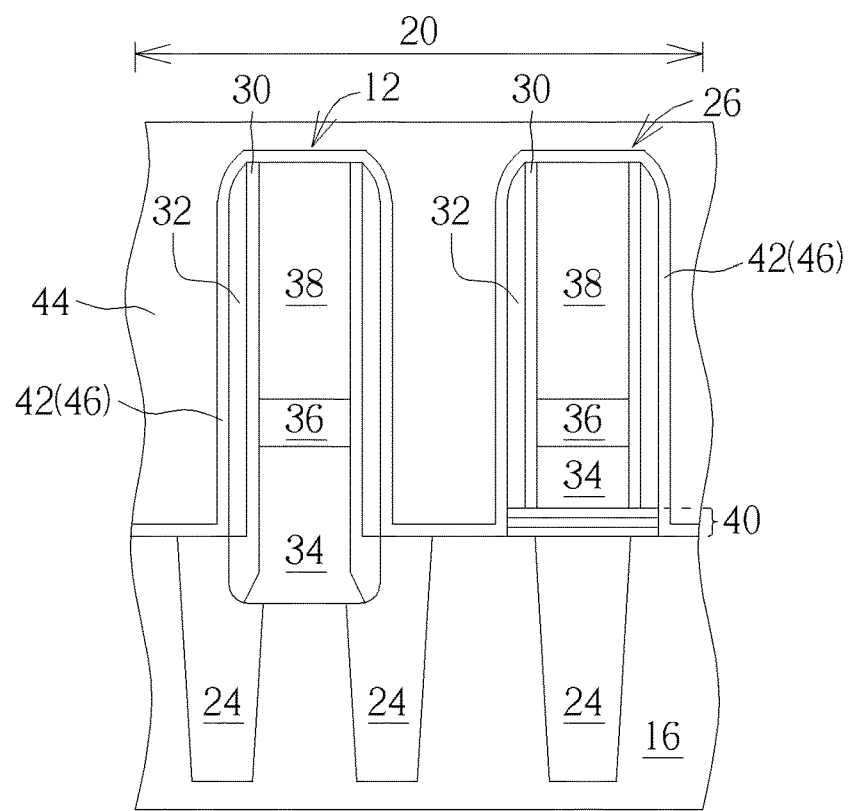

Next, as shown in FIG. 3, a liner 42 and an interlayer dielectric (ILD) layer 44 are sequentially formed on the bit line structures 12, 26, the substrate 16, and the STI 24 on the memory region 20 and the gate structure on the periphery region, in which the liner 42 disposed on the periphery region could be used as a contact etch stop layer (CESL) while the liner 42 disposed on the memory region 20 is serving as a third spacer 46 on sidewalls of the second spacers 32. In this embodiment, the first spacer 30 and the third spacer 46 are preferably made of same material while the second spacer 32 and the first spacer 30 (or the third spacer 46) are made of different material. For instance, the first spacer 30 and the third spacer 46 in this embodiment are preferably made of silicon carbon nitride (SiCN) while the second spacer 32 is made of silicon oxide. Nevertheless, according to other embodiments of the present invention, the first spacer 30 and the third spacer 46 could be made of first dielectric material and the second spacer 32 is made of second dielectric material while both the first dielectric material and the second dielectric material could be selected from the group consisting of $SiO_2$, SiN, SiON, and SiCN. The ILD layer 44 is preferably made of oxides such as tetraethyl orthosilicate (TEOS), but not limited thereto.

Figure 4:
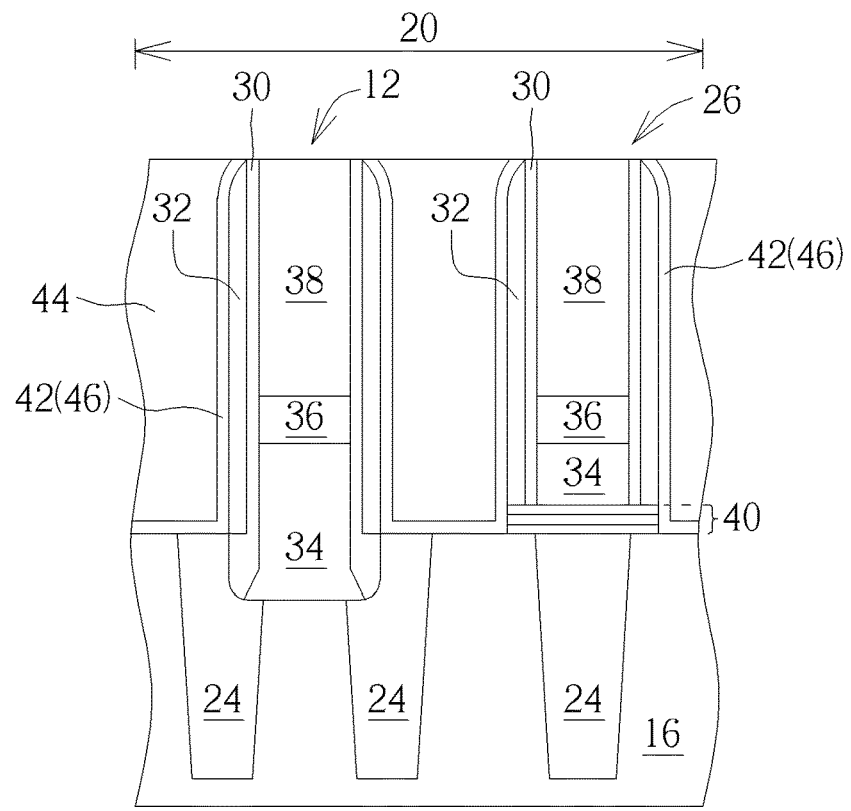

Next, as shown in FIG. 4, a planarizing process such as chemical mechanical polishing (CMP) process is conducted to remove part of the ILD layer 44. It should be noted that part of the first spacer 30 and part of the third spacer 46 could be removed during the planarizing process to expose the top surface of the mask layer 38 within each of the bit line structures 12, 26 so that the top surfaces of the first spacer 30, the third spacer 46, and the ILD layer 44 are coplanar. It should be further noted that the top surface of the second spacer 32 is not exposed at this stage.

Figure 5:
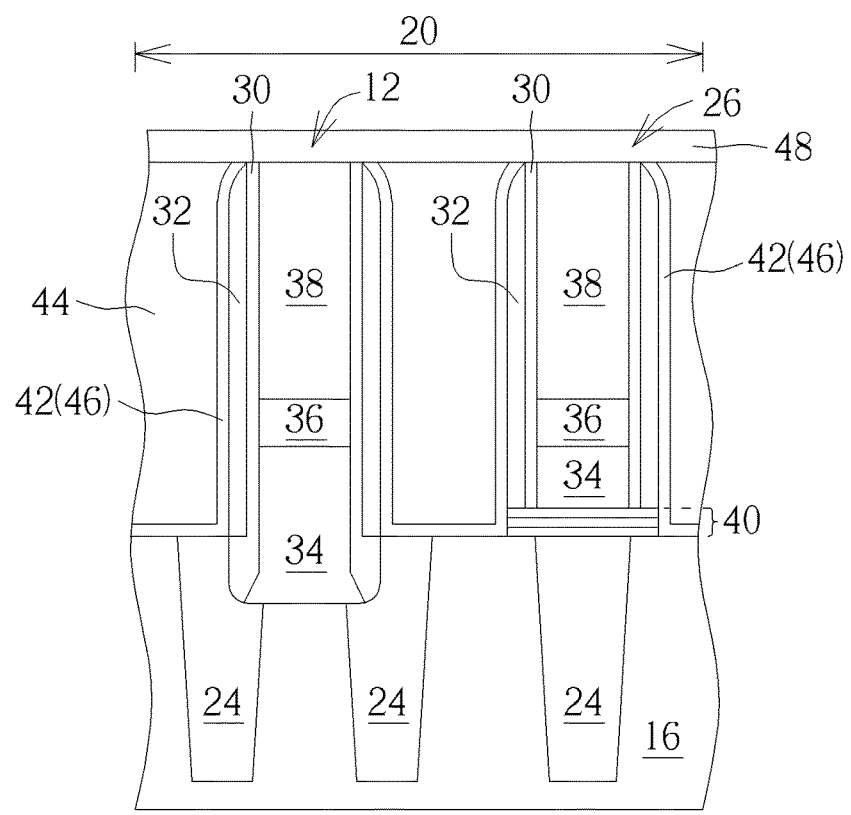

Next, as shown in FIG. 5, a mask layer 48 is formed on the ILD layer 44 on the memory region 20 and the periphery region. In this embodiment, the mask layer 48 could include dielectric material such as but not limited to for example silicon nitride.

Figure 6:
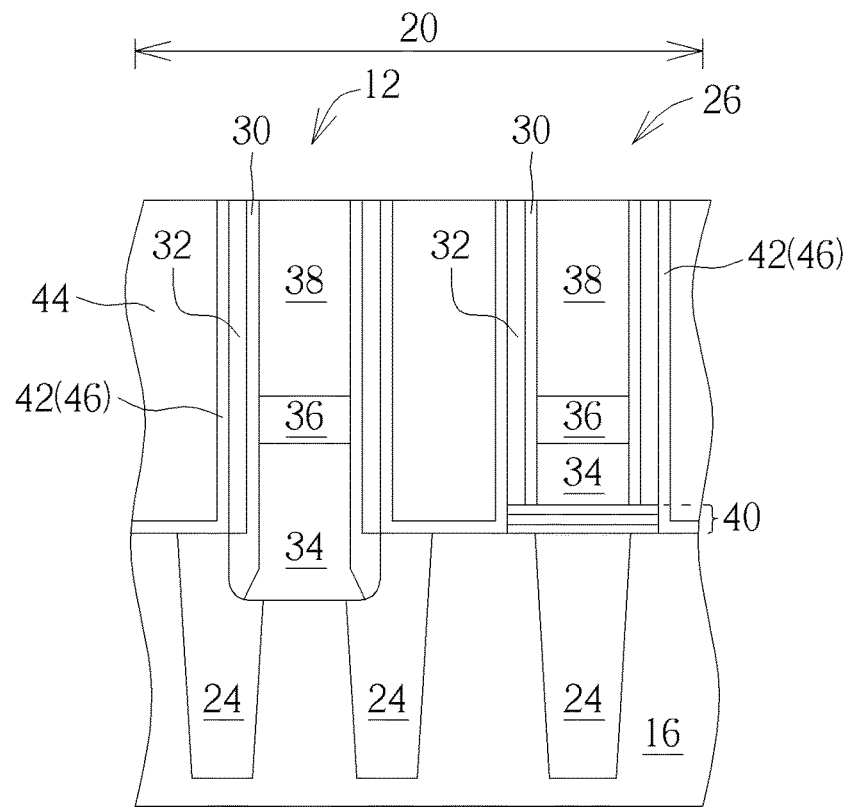

Next, as shown in FIG. 6, a photo-etching process is conducted by first forming a patterned mask (not shown) on the periphery region, and then conducting a dry etching process to remove the mask layer 48 on the memory region 20 and expose the surface of the ILD layer 44. It should be noted that part of the mask layer 38, part of the first spacer 30, part of the second spacer 32, and part of the third spacer 46 under the mask layer 48 could be removed during the removal of the mask layer 48 on the memory region 20, hence the top surface of the mask layer 38 is preferably even with the top surfaces of the first spacer 30, the second spacer 32, and the third spacer 46 after the mask layer 48 is removed.

Figure 7:
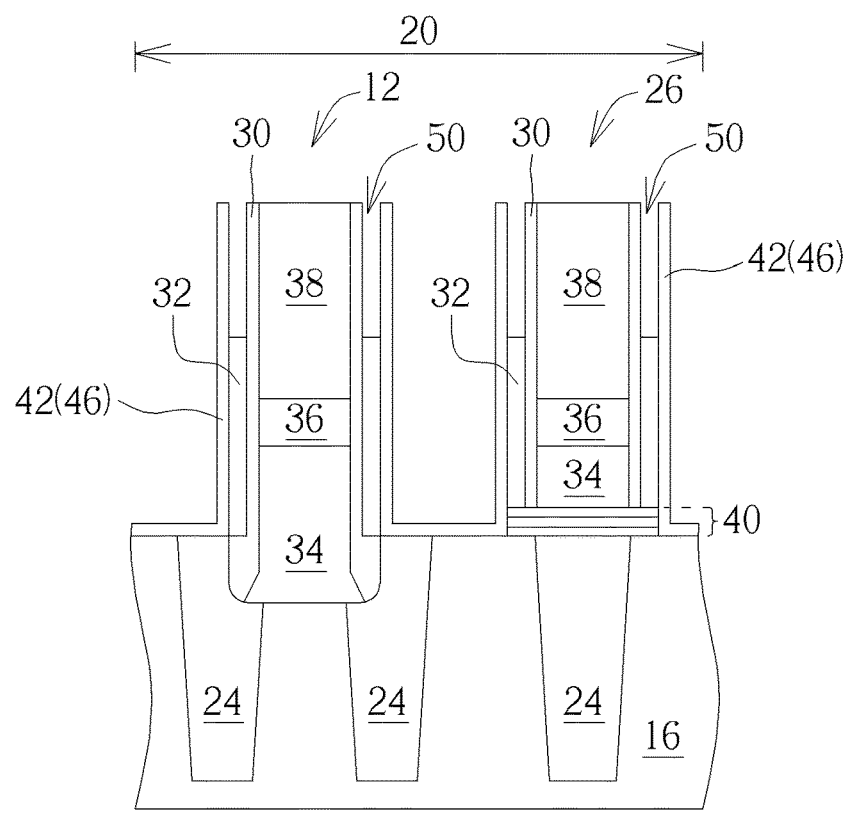

Next, as shown in FIG. 7, an etching process is conducted to remove the ILD layer 44 completely. It should be noted that since the top surface of the second spacers 32 is exposed after removing the mask layer 48 and also the fact that both the second spacer 32 and the ILD layer 44 are made of oxides, part of the second spacers 32 are preferably removed at the same time when the ILD layer 44 is removed to form recesses 50 between the first spacers 30 and the third spacers 46. In this embodiment, the bottom surface of each of the recesses 50 is preferably higher than the top surface of the metal layers 36 and the etching process conducted to remove the ILD layer 44 and part of the second spacers 32 preferably includes a wet etching process, which could be accomplished by using etchant such as diluted hydrofluoric acid (dHF), but not limited thereto.

Figure 8:
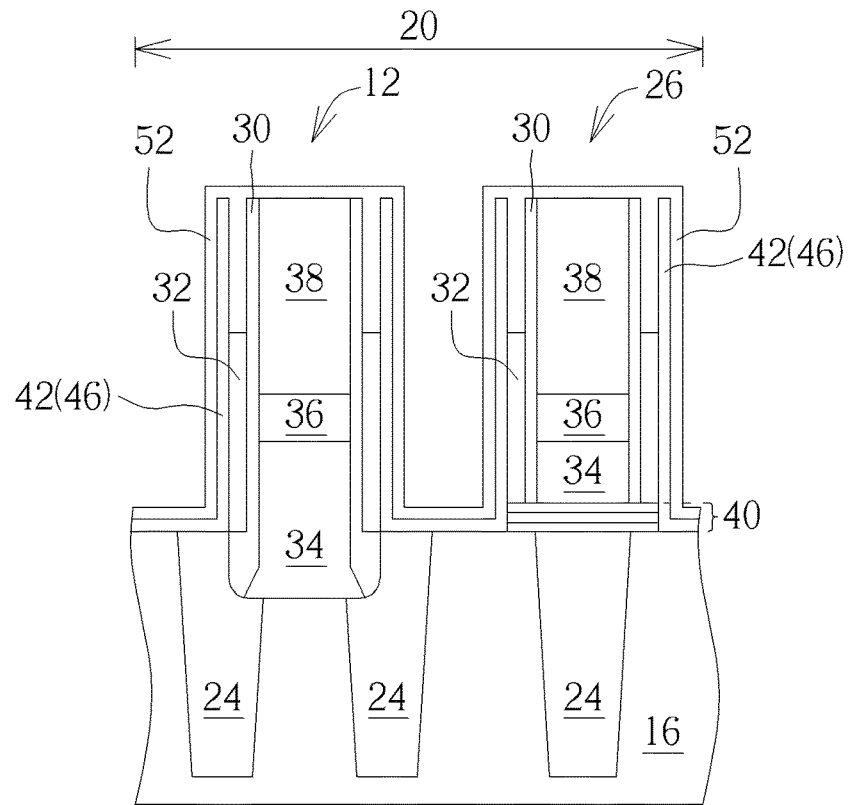

Next, as shown in FIG. 8, an atomic layer deposition (ALD) process is conducted to form a liner 52 on the bit line structures 12, 26, in which the liner 52 preferably covers the surface of the mask layers 38, the first spacers 30, and the third spacers 46 and fills the recesses 50 completely. In this embodiment, the liner 52 is preferably made of dielectric material including but not limited to for example silicon nitride.

Figure 9:
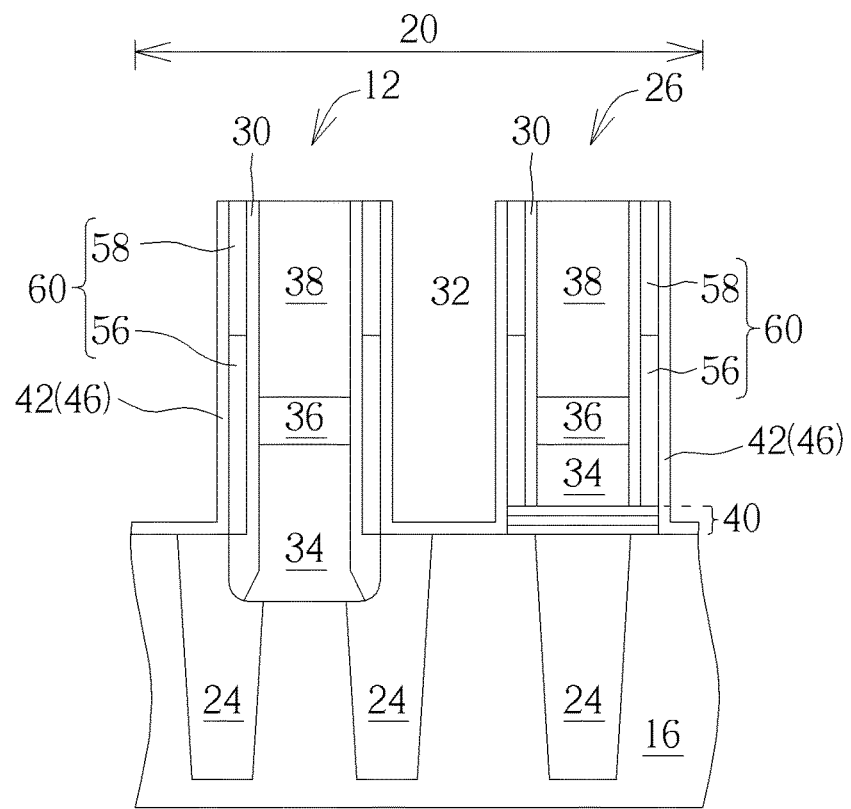

Next, as shown in FIG. 9, an etching process or more specifically a wet etching process is conducted by using etchant such as phosphoric acid to remove part of liner 52 on top surface of the mask layers 38, the first spacers 30, and the third spacers 46 as well as part of liner 52 on sidewalls of the third spacers 46. This forms a new second spacer 60 between the first spacer 30 and the third spacer 46, in which the top surface of the remaining liner 52 or the new second spacer 60 is even with the top surface of the first spacer 30 and the third spacer 46

Figure 10:
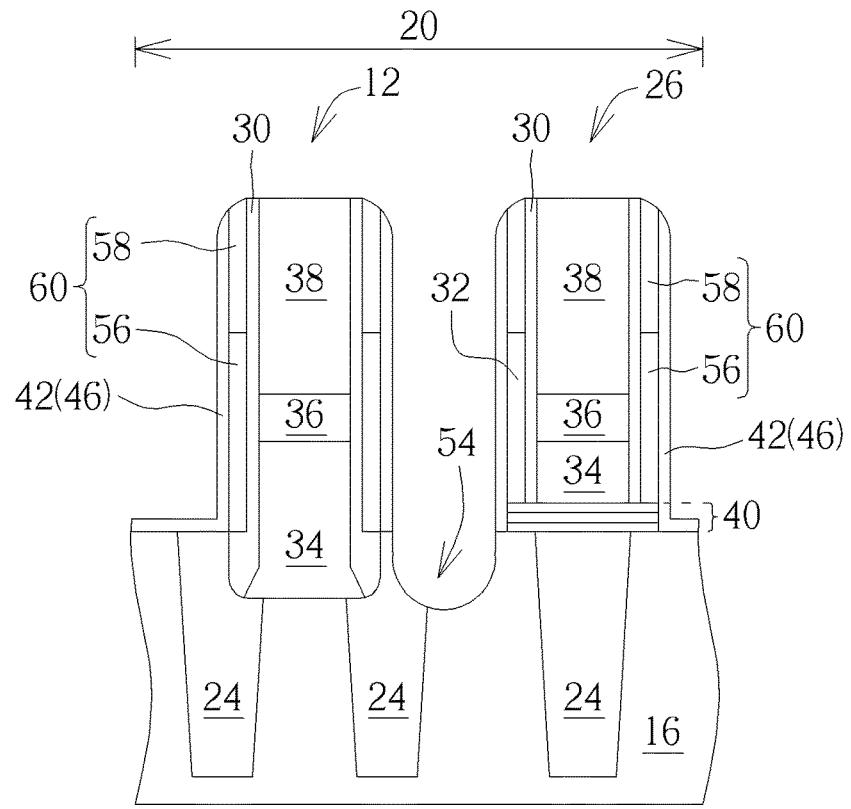

Next, as shown in FIG. 10, an etching process is conducted to remove part of the substrate 16 between the bit line structure 12 and the bit line structure 26 to form a recess 54 and at the same time remove part of the second spacers 60 and part of the third spacers 46 so that the top surface of the second spacers 60 and third spacers 46 reveal curved profiles. Preferably, conductive material could be deposited into the recess 54 in the later process to form storage node contacts. This completes the fabrication of a semiconductor device according to an embodiment of the present invention.

Referring again to FIG. 10, FIG. 10 illustrates a structural view of a semiconductor device according to an embodiment of the present invention. As shown in FIG. 10, the semiconductor device includes at least a bit line structure 12 disposed on the substrate 16, a first spacer 30 around the bit line structure 12, a second spacer 60 on a sidewall of the first spacer 30, and a third spacer 46 on a sidewall of the second spacer 60.

The second spacer 60 further includes a bottom portion 56 and a top portion 58, in which the bottom portion 56 and the top portion 58 preferably include different material while the first spacer 30 and the third spacer 46 include same material. For instance, the bottom portion 56 in this embodiment preferably includes silicon oxide and the top portion 58 includes silicon nitride while both the first spacer 30 and the third spacer 46 include SiCN.

The bit line structure 12 preferably includes a non-metal conductive layer 34, a metal layer 36, and a mask layer 38, in which the top surface of the bottom portion 56 of the second spacer 60 is preferably higher than the top surface of the metal layer 36, the bottom surface of the bottom portion 56 is lower than the top surface of the conductive layer 34, and the bottom surface of the top portion 58 is higher than the top surface of the metal layer 36.

Figure 11:
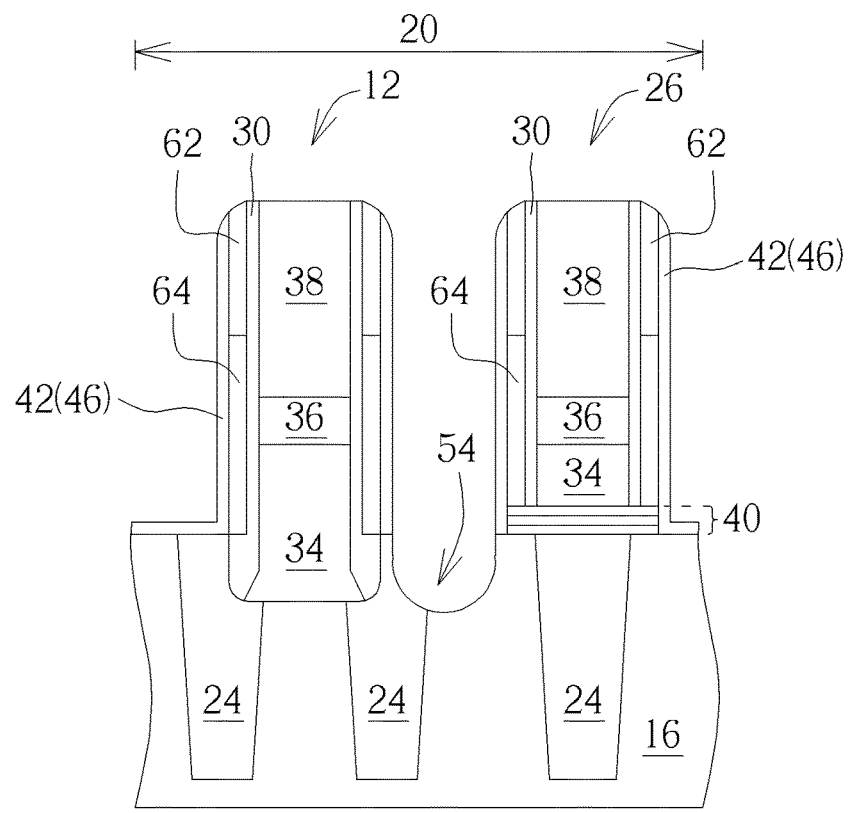
FIG. 11 illustrates a structural view of a semiconductor device according to an embodiment of the present invention.

Referring to FIG. 11, FIG. 11 illustrates a structural view of a semiconductor device according to an embodiment of the present invention. As shown in FIG. 11, in contrast to the aforementioned approach of conducting a wet etching process to remove only part of the second spacer 60 as shown in FIG. 7, it would also be desirable to adjust the parameter or recipe of the wet etching process by removing all of the second spacer 60 when the ILD layer 40 is removed. The removal of the entire second spacer 60 preferably forms a recess between the first spacer 30 and the second spacer 46, in which the recess exposes the lower or bottom portion of the first spacer 30. Next, processes disclosed in FIGS. 8-10 are carried out to first conduct an ALD process to form a liner 52 on the surface of the mask layers 38, the first spacers 30, and the third spacers 46, use an etching process to remove part of the liner 52, and then continue with the formation of storage node contacts afterwards.

It should be noted that the present embodiment preferably adjusts the parameter of the ALD process during the formation of the liner 52 so that the liner 52 only partially fills the recess to form a second spacer 62 between the first spacer 30 and the third spacer 46 and at the same time forms an air gap 64 directly under the second spacer 62. Structurally, the bottom surface of the second spacer 62 is higher than the top surface of the metal layer 36, the top surface of the air gap 64 is higher than the top surface of the metal layer 36, the bottom surface of the air gap 64 is lower than the top surface 34 of the conductive layer 34, and the air gap 64 is surrounded by the first spacer 30, the second spacer 62, and the third spacer 46.

Overall, it has been commonly observed that when the ILD layer 44 is removed by etching process in FIG. 7, part of the second spacer 32 is often removed at the same time to form seams or voids between the first spacer 30 and the third spacer 46 inducing storage contact leakage in the later process. In order to resolve this issue, the present invention preferably conducts an ALD process to fill a dielectric material such as SiN into the recess or void between the first spacer 30 and the third spacer 46 after the ILD layer 44 is removed. By doing so, issues such as storage node contact leakage could be controlled and improved significantly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
a bit line structure on a substrate;
a first spacer around the bit line structure, wherein a bottom surface of the first spacer is even with a bottom surface of the bit line structure;
a second spacer on a sidewall of the first spacer, wherein the second spacer comprises a bottom portion and a top portion, the bottom portion and the top portion comprise different dielectric materials, the bottom portion comprises silicon oxide and the top portion comprises silicon nitride, sidewalls of the bottom portion are vertically aligned with sidewalls of the top portion, and the bottom surface of the first spacer is lower than a bottom surface of the second spacer; and
a third spacer on a sidewall of the second spacer, wherein the third spacer is asymmetrical shaped on two sides, with one side being L-shaped, while another side being I-shaped, and the first spacer extends downwardly into and contacting a shallow trench isolation disposed under the third spacer.

2. The semiconductor device of claim 1, wherein the first spacer and the third spacer comprise same material.

3. The semiconductor device of claim 1, wherein the bit line structure comprises a conductive layer, a metal layer on the conductive layer, and a mask layer on the metal layer.

4. The semiconductor device of claim 3, wherein a top surface of the bottom portion is higher than a top surface of the metal layer.

5. The semiconductor device of claim 3, wherein a bottom surface of the bottom portion is lower than a top surface of the conductive layer.

6. The semiconductor device of claim 3, wherein a bottom surface of the top portion is higher than a top surface of the metal layer.

* * * * *